(12) United States Patent
Lee et al.

(10) Patent No.: US 9,941,485 B2
(45) Date of Patent: Apr. 10, 2018

(54) DISPLAY APPARATUS AND A METHOD OF MANUFACTURING THE SAME

(71) Applicant: SAMSUNG DISPLAY CO., LTD., Yongin-si, Gyeonggi-Do (KR)

(72) Inventors: Byoungduk Lee, Yongin-si (KR); Eungseok Park, Yongin-si (KR); Wonmin Yun, Yongin-si (KR); Yunah Chung, Yongin-si (KR); Yoonhyeung Cho, Yongin-si (KR); Yongchan Ju, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/388,495

(22) Filed: Dec. 22, 2016

(65) Prior Publication Data

US 2017/0186999 A1 Jun. 29, 2017

(30) Foreign Application Priority Data

Dec. 23, 2015 (KR) ........................ 10-2015-0185101

(51) Int. Cl.
*H01L 35/24* (2006.01)
*H01L 51/00* (2006.01)
(Continued)

(52) U.S. Cl.
CPC ........ *H01L 51/5256* (2013.01); *H01L 27/323* (2013.01); *H01L 27/3244* (2013.01); *H01L 51/5237* (2013.01); *H01L 2227/323* (2013.01)

(58) Field of Classification Search
CPC ............... H01L 51/5256; H01L 27/323; H01L 27/3244; H01L 51/5237; H01L 2227/323
(Continued)

(56) References Cited

U.S. PATENT DOCUMENTS 9,048,443 B2 6/2015 Namkung et al.
9,095,017 B2 7/2015 Yl et al.
(Continued)

FOREIGN PATENT DOCUMENTS

KR 10-2014-0025251 3/2014
KR 10-2014-0074090 6/2014
(Continued)

*Primary Examiner* — Thien F Tran
(74) *Attorney, Agent, or Firm* — F. Chau & Associates, LLC

(57) ABSTRACT

A display apparatus including a substrate; a display unit disposed on the substrate; a sealing layer disposed on the display unit; a touch screen layer disposed on the sealing layer; and a buffer layer disposed between the sealing layer and the touch screen layer. The sealing layer includes n sealing units each including an organic layer and an inorganic layer, in which n is an integer of 1 or greater. The organic layer and the inorganic layer are sequentially stacked on the display unit. The organic layer includes a cured product for forming an organic layer including a first photocurable monomer. The buffer layer includes a cured product for forming a buffer layer including a second and third photocurable monomer. The first and second photocurable monomers include a photocurable functional group. The third photocurable monomer is represented by Formulae 1A to 1C.

[Formula 1A]

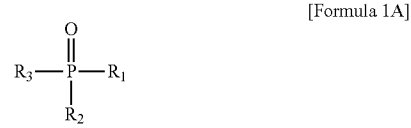

[Formula 1B]

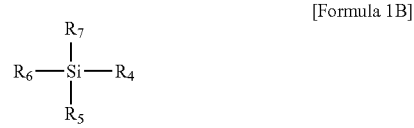

[Formula 1C]

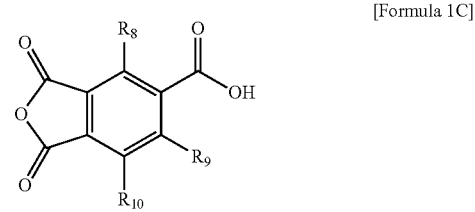

20 Claims, 4 Drawing Sheets

(51) Int. Cl.
*H01L 51/52* (2006.01)
*H01L 27/32* (2006.01)
(58) Field of Classification Search
USPC .......................................................... 257/40
See application file for complete search history.

(56) References Cited

U.S. PATENT DOCUMENTS

| | | | |
|---|---|---|---|
| 2015/0162392 A1* | 6/2015 | Lim | .................... H01L 27/3244 257/72 |
| 2016/0017170 A1 | 1/2016 | Lee et al. | |
| 2016/0099299 A1* | 4/2016 | Chung | ................ H01L 27/3276 257/40 |
| 2017/0125501 A1* | 5/2017 | Lim | .................... H01L 27/3262 |

FOREIGN PATENT DOCUMENTS

| | | |
|---|---|---|
| KR | 10-2014-0076426 | 6/2014 |
| KR | 10-2014-0085306 | 7/2014 |
| KR | 10-2014-0115883 | 10/2014 |
| KR | 10-2015-0007632 | 1/2015 |

* cited by examiner

DISPLAY APPARATUS AND A METHOD OF MANUFACTURING THE SAME

CROSS-REFERENCE TO RELATED APPLICATION

This application claims priority under 35 U.S.C. § 119 to Korean Patent Application No. 10-2015-0185101, filed on Dec. 23, 2015 in the Korean Intellectual Property Office, the disclosure of which is incorporated by reference herein in its entirety.

TECHNICAL FIELD

Exemplary embodiments of the present invention relate to a display apparatus, and more particularly to a method of manufacturing the same.

DISCUSSION OF RELATED ART

A display apparatus may be included in various electronic devices. A display apparatus may include a touch panel. The display apparatus may function as an input device when a user touches a surface of the display apparatus.

Organic-light emitting devices may be self-emitting display apparatuses. Organic light-emitting devices may include a hole injection electrode, an electron injection electrode, and an organic emission layer. The organic emission layer may be disposed between the hole injection electrode and the electron injection electrode. Organic-light emitting devices may be self-emitting display apparatus in which holes injected through the hole injection electrode and electrons injected through the electron injection electrode may recombine and disappear, thus generating light. Organic-light emitting devices may have relatively low consumption power, relatively high luminance, and relatively high reaction rates.

SUMMARY

One or more exemplary embodiments of the present invention provide a display apparatus and a method of manufacturing the same.

According to one or more exemplary embodiments of the present invention, a display apparatus includes a substrate; a display unit disposed on the substrate; a sealing layer disposed on the display unit; a touch screen layer disposed on the sealing layer; and a buffer layer disposed between the sealing layer and the touch screen layer. The sealing layer includes n sealing units. The n sealing units each include an organic layer and an inorganic layer. The organic layer and the inorganic layer are sequentially stacked on the display unit. n is an integer of 1 or greater. The organic layer of the sealing unit includes a cured product. The cured product is of a composition for forming an organic layer. The composition for forming the organic layer includes a first photocurable monomer. The buffer layer includes a cured product for forming a buffer layer. The cured product for forming the buffer layer includes a second photocurable monomer and a third photocurable monomer. The first photocurable monomer and the second photocurable monomer include a photocurable functional group. The third photocurable monomer is selected from compounds represented by Formulae 1A to 1C:

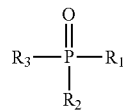
<Formula 1A>

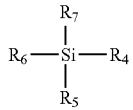
<Formula 1B>

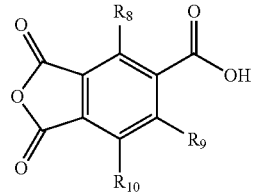
<Formula 1C>

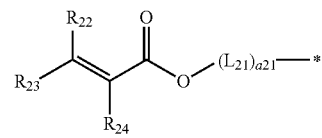
<Formula 2>

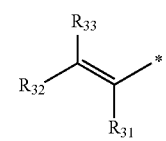
<Formula 3>

In Formulae 1A to 1C, 2, and 3:

$R_1$ to $R_{10}$ are each independently selected from a group represented by Formula 2, a group represented by Formula 3, hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);

$R_{22}$ to $R_{24}$, and $R_{31}$ to $R_{33}$ are each independently selected from hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);

$L_{21}$ is selected from *—$R_{21}$O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

$R_{21}$ is a substituted or unsubstituted $C_1$-$C_{60}$ alkylene group;

a21 is an integer selected from 0 to 3;

* and * ' each indicate a binding site to a neighboring atom; and at least one substituent of the substituted $C_1$-$C_{60}$ alkylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, or substituted monovalent non-aromatic hetero-condensed polycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group.

$Q_1$ to $Q_3$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group.

According to one or more exemplary embodiments of the present invention, a method of manufacturing a display apparatus includes providing a substrate; forming a display unit on the substrate; and forming a sealing layer on the display unit, The sealing layer includes n sealing units. The n sealing units each include an organic layer and an inorganic layer. The organic layer and the inorganic layer are sequentially stacked on the display unit. n is an integer of 1 or greater. A buffer layer is formed on the sealing layer. A touch screen layer is formed on the buffer layer. The organic layer of at least one of the sealing units includes a cured product for forming an organic layer. The cured product for forming an organic layer includes a first photocurable monomer. The buffer layer includes a cured product for forming a buffer layer. The cured product for forming a buffer layer includes a second photocurable monomer and a third photocurable monomer. The first photocurable monomer and the second photocurable monomer each include a photocurable functional group. The third photocurable monomer is selected from compounds represented by Formulae 1A to 1C. In Formulae 1A to 1C, 2, and 3:

$R_1$ to $R_{10}$ are each independently selected from a group represented by Formula 2, a group represented by Formula 3, hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);

$R_{22}$ to $R_{24}$, and $R_{31}$ to $R_{33}$ are each independently selected from hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);

$L_{21}$ is selected from *$R_{21}$O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

$R_{21}$ is a substituted or unsubstituted $C_1$-$C_{60}$ alkylene group;

a21 is an integer selected from 0 to 3;

* and * each indicate a binding site to a neighboring atom; and at least one substituent of the substituted $C_1$-$C_{60}$ alkylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic hetero-condensed polycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group.

$Q_1$ to $Q_3$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
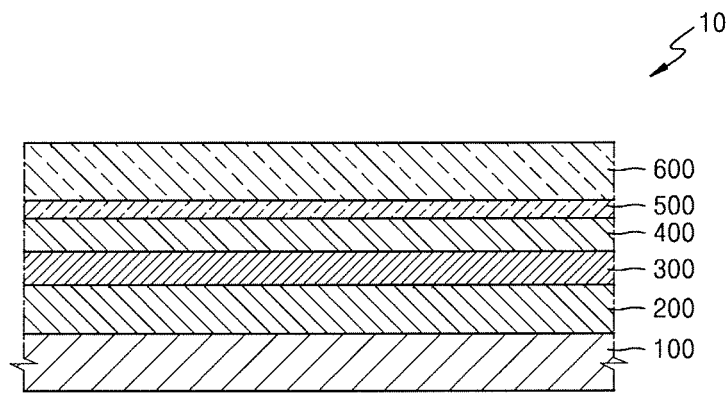
FIG. 1 is a schematic cross-sectional view illustrating a structure of a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

It will be understood that a specific process order may be performed differently from the described order. For example, two consecutively described processes may be performed substantially at the same time or performed in an order opposite to the described order.

Figure 2:
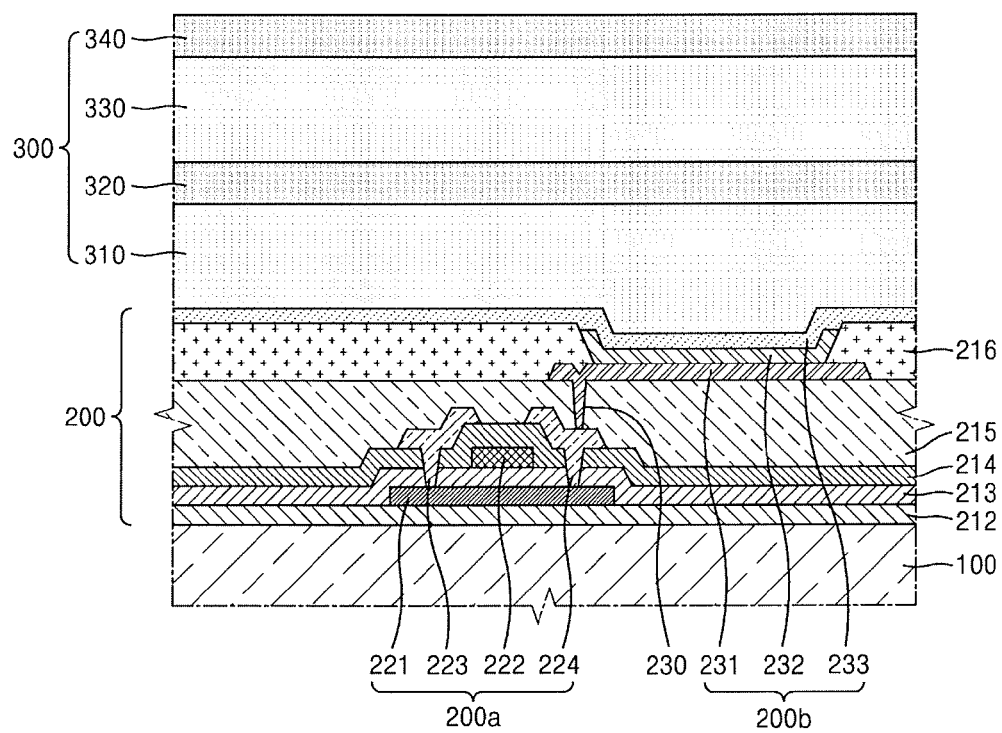
FIG. 2 is a schematic cross-sectional view illustrating structures of a display unit and a sealing layer of the display apparatus of FIG. 1 according to an exemplary embodiment of the present invention.

FIG. 1 is a schematic cross-sectional view illustrating a structure of a display apparatus according to an exemplary embodiment of the present invention. FIG. 2 is a schematic cross-sectional view illustrating structures of a display unit and a sealing layer of the display apparatus of FIG. 1 according to an exemplary embodiment of the present invention.

Referring to FIGS. 1 and 2, a display apparatus 10 may include a substrate 100, a display unit 200, a sealing layer 300, a touch screen layer 500, and a buffer layer 400. The display unit 200 may be disposed on the substrate 100. The sealing layer 300 may be disposed on the display unit 200. The touch screen layer 500 may be disposed on the sealing layer 300. The buffer layer 400 may be disposed between the sealing layer 300 and the touch screen layer 500. The buffer layer 400 may be in direct contact with the touch screen layer 500. According to an exemplary embodiment of the present invention, the display apparatus 10 may include a cover layer 600. The cover layer 600 may be disposed on the touch screen layer 500.

The substrate 100 may be a flexible substrate. The substrate 100 may include plastic. For example, the substrate 100 may include polyethersulphone (PES), polyacrylate (PAR), polyetherimide (PEI), polyethylene naphthalene (PEN), polyethylene terephthalate (PET), polyphenylene sulfide (PPS), polyallylate, polyimide (PI), polycarbonate (PC), cellulose triacetate (TAC), or cellulose acetate propionate (CAP); however, exemplary embodiments of the present invention are not limited thereto.

The display apparatus 10 may be a bottom-emitting type display. Alternatively, the display apparatus 10 may be a top-emitting type display. When the display apparatus 10 is a bottom-emitting type display that displays an image toward the substrate 100, the substrate 100 may include a transparent material. However, when the display apparatus 10 is a top-emitting type display that displays an image toward the sealing layer 300, the substrate 100 might not include a transparent material. The substrate 100 may include a flexible non-transparent metal. When the substrate 100 includes a metal, the substrate 100 may include at least one selected from iron, chromium, manganese, nickel, titanium, molybdenum, stainless steel (SUS), an Invar alloy, an Inconel alloy, and a Kovar alloy; however, exemplary embodiments of the present invention are not limited thereto. The substrate 100 may include a metal foil.

The display unit 200 may be formed on the substrate 100. An image may be formed by the display unit 200. According to an exemplary embodiment of the present invention, the display unit 200 may include a thin film transistor 200a. The display unit 200 may include an organic light-emitting device 200b. However, exemplary embodiments of the present invention are not limited thereto.

Referring to FIG. 2, a protection layer 212 may be formed on the substrate 100. The protection layer 212 may be configured to decrease penetration of impurities through the substrate 100. The protection layer 212 may provide a substantially flat surface on the substrate 100. Thus, the protection layer 212 may include a material forming a substantially flat surface. For example, the protection layer 212 may include an inorganic material such as a silicon oxide, a silicon nitride, a silicon oxynitride, an aluminum oxide, an aluminum nitride, a titanium oxide, or a titanium nitride. The protection layer 212 may include an organic material such as polyimide, polyester, or acryl. The protection layer 212 may have a stacked structure. The stacked structure may include materials selected therefrom.

The thin film transistor 200a may be formed on the protection layer 212. The thin film transistor 200a may include an active layer 221, a gate electrode 222, a source electrode 223, and a drain electrode 224.

The active layer 221 may include an inorganic semiconductor such as silicon. Alternatively, the active layer 221 may include an organic semiconductor. The active layer 221 may include a source region, a drain region, and a channel region. The channel region may be disposed between the source region and the drain region. As an example, when the active layer 221 includes an amorphous silicon, an amorphous silicon layer may be formed on substantially the entire upper surface of the substrate 100. A resultant structure may be crystallized and may form a polycrystalline silicon layer. The polycrystalline silicon layer may be patterned. The source region and the drain region may be doped with impurities. The source region and the drain region may be doped with impurities at the edges of the polycrystalline silicon layer. Thus, the active layer 221 including the source region, the drain region, and the channel region disposed between the source region and the drain region may be formed.

A gate insulating layer 213 may be formed on the active layer 221. The gate insulating layer 213 may be configured to insulate the gate electrode 222 from the active layer 221. The gate insulating layer 213 may include an inorganic material such as SiNx or $SiO_2$; however, exemplary embodiments of the present invention are not limited thereto.

The gate electrode 222 may be formed on a predetermined region of the gate insulating layer 213. The gate electrode 222 may be connected to a gate line. The gate line may transmit an ON/OFF signal to the thin film transistor 200a. The gate electrode 222 may include Au, Ag, Cu, Ni, Pt, Pd, Al, or Mo or an alloy such as an Al:Nd or Mo:W alloy; however, exemplary embodiments of the present invention are not limited thereto. The gate electrode 222 may include various materials, as desired.

An interlayer insulating layer 214 may be formed on the gate electrode 222. The interlayer insulating layer 214 may insulate the gate electrode 222 from the source electrode 223. The interlayer insulating layer 214 may insulate the gate electrode 222 from the drain electrode 224. The interlayer insulating layer 214 may include an inorganic material such as SiNx or $SiO_2$; however, exemplary embodiments of the present invention are not limited thereto.

The source electrode 223 and the drain electrode 224 may be formed on the interlayer insulating layer 214. The interlayer insulating layer 214 and the gate insulating layer 213 may expose the source region and the drain region of the active layer 221. The source electrode 223 and the drain electrode 224 may respectively be in direct contact with the exposed source region and drain region of the active layer 221.

The source electrode 223 and the drain electrode 224 may include at least one material selected from aluminum (Al), platinum (Pt), palladium (Pd), silver (Ag), magnesium(Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu); however, exemplary embodiments of the present invention are not limited thereto. The source electrode 223 and the drain electrode 224 may have a single layer structure. Alternatively, the source electrode 223 and the drain electrode 224 may have a multi-layered structure.

FIG. 2 illustrates the thin film transistor 200a of a top gate-type display, which sequentially includes the active layer 221, the gate electrode 222, the source electrode 223, and the drain electrode 224; however, exemplary embodiments of the present invention are not limited thereto. For example, the gate electrode 222 may be disposed below the active layer 221.

The thin film transistor 200a may be electrically connected to the organic light-emitting device 200b. The thin film transistor 222 may transmit a signal to the organic light-emitting device 200b. The signal may be for driving the organic light-emitting device 200b. The thin film transistor 200a may be covered with a planarization layer 215. Thus, the thin film transistor 200a may be protected from the outside.

The planarization layer 215 may include an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, or PZT; however, exemplary embodiments of the present invention are not limited thereto. The organic insulating layer may include poly(methylmethacrylate) (PMMA), polystyrene (PS), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, or any combination thereof; however, exemplary embodiments of the present invention are not limited thereto. The planarization layer 215 may have a composite stacked structure. The composite stacked structure may include the inorganic insulating layer and the organic insulating layer.

The organic light-emitting device 200b may be formed on the planarization layer 215. The organic light-emitting device 200b may include a pixel electrode 231, an interlayer 232, and a counter electrode 233.

The pixel electrode 231 may be formed on the planarization layer 215. The pixel electrode 231 may be electrically connected to the drain electrode 224. The pixel electrode 231 may be electrically connected to the drain electrode 224 via a contact hole 230. The contact hole 230 may be formed in the planarization layer 215.

The pixel electrode 231 may be a reflective electrode, a transmissive electrode, or a semi-transmissive electrode. When the pixel electrode 231 is a reflective electrode, the pixel electrode 231 may include a reflective layer including Ag, Mg, Al, Pt, Pd, Au, Ni, Nd, Ir, Cr, or any combination thereof; however, exemplary embodiments of the present invention are not limited thereto. When the pixel electrode 231 is a transmissive electrode or a semi-transmissive electrode, the pixel electrode 231 may include a transmissive electrode layer or a semi-transmissive electrode layer, respectively. The transmissive electrode layer or the semi-transmissive electrode layer may be formed on the reflective layer. The transmissive electrode layer or the semi-transmissive electrode layer may include indium tin oxide (ITO), indium zinc oxide (IZO), zinc oxide (ZnO), indium oxide ($In_2O_3$), indium gallium oxide (IGO), or aluminum zinc oxide (AZO); however, exemplary embodiments of the present invention are not limited thereto.

The counter electrode 233 may be a transmissive electrode or semi-transmissive electrode. The counter electrode 233 may face the pixel electrode 231. The counter electrode 233 may include a metal thin film. The metal thin film may include Li, Ca, LiF/Ca, LiF/Al, Al, Ag, Mg, or a compound thereof, which may have a relatively low work function. An auxiliary electrode layer or a bus electrode may be formed on the metal thin film. The auxiliary electrode layer or the bus electrode may include a material for forming a transmissive electrode such as ITO, IZO, ZnO, or $In_2O_3$; however, exemplary embodiments of the present invention are not limited thereto.

The counter electrode 233 may transmit light emitted from an emission layer. The emission layer may be disposed in the interlayer 232. For example, light from the emission layer may be directly emitted or reflected by the pixel electrode 231 including a reflective electrode toward the counter electrode 233.

The display unit 200 is not limited to a top-emitting type display. The display unit 200 may be a bottom-emitting type display in which light emitted from the emission layer may be emitted toward the substrate 100. In this case, the pixel electrode 231 may include a transmissive electrode or a semi-transmissive electrode, and the counter electrode 233 may include a reflective electrode. The display unit 200 may be a dual-emitting type display. The dual-emitting type display may emit light toward both the top and the bottom of the display.

A pixel-defining layer 216 may include an insulating material. The pixel-defining layer 216 may be disposed on the pixel electrode 231. The pixel-defining layer 216 may include at least one organic insulating material including polyimide, polyamide, acryl resin, benzocyclobutene, or a phenol resin; however, exemplary embodiments of the present invention are not limited thereto. The pixel-defining layer 216 may be formed by spin coating. The pixel-defining layer 216 may expose a predetermined area of the pixel electrode 231. The interlayer 232 may be positioned at the exposed area of the pixel electrode 231. The interlayer 232 may include an organic emission layer.

The organic emission layer of the interlayer 232 may include a low molecular weight organic material. Alternatively, the organic emission layer of the interlayer 232 may include a high molecular weight organic material. The interlayer 232 may include a functional layer. The functional layer may be a hole transport layer (HTL), a hole injection layer (HIL), an electron transport layer (ETL), or an electron injection layer (EIL).

The sealing layer 300 may be formed on the counter electrode 233. The sealing layer 300 may cover substantially the entire display unit 200. Thus, penetration of water and oxygen from the outside into the display unit 200 may be reduced or eliminated. An area of the sealing layer 300 may be larger than an area of the display unit 200. Thus, the sealing layer 300 may be in direct contact with the substrate 100. Thus, penetration of air from the outside may be reduced or eliminated.

The sealing layer 300 may include n sealing units, in which n is an integer of 1 or greater. The n sealing units may each include an organic layer and an inorganic layer. The organic layer and the inorganic layer may be sequentially stacked on the display unit 200. The sealing layer 300 may include two sealing units. For example, the sealing layer 300 may include two inorganic layers 320 and 340. The sealing layer 300 may include two organic layers 310 and 330. However, exemplary embodiments of the present invention are not limited thereto. The sealing layer 300 may include a plurality of organic layers and a plurality of inorganic layers. The plurality of organic layers and the plurality of inorganic layers may be sequentially stacked on the display unit 200.

According to an exemplary embodiment of the present invention, the display apparatus 100 may include a lower inorganic layer. The lower inorganic layer may be disposed between the sealing layer 300 and the display unit 200.

The inorganic layers 320 and 340 may include a metal, a metal nitride, a metal oxide, a metal nitrate, a metal carbide, or any combination thereof. For example, the inorganic layers 320 and 340 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon nitrate (SiON), or any combination thereof.

The inorganic layers 320 and 340 may be larger than the organic layers 310 and 330. Thus, the inorganic layers 320 and 340 and the organic layers 310 and 330 may be in direct contact with each other at outer edges of the inorganic layers 320 and 340. Thus, penetration of oxygen or water from the outside may be reduced or eliminated.

A thickness of the inorganic layers 320 and 340 may be in a range of from about 100 Å to about 5,000 Å, for example, from about 500 Å to about 3,000 Å; however, exemplary embodiments of the present invention are not limited thereto. When the thickness of the inorganic layers 320 and 340 is within this range, the sealing layer 300 may provide increased sealing characteristics.

The organic layers 310 and 330 may planarize a height difference. The height different may be produced by the pixel-defining layer 216. The organic layers 310 and 330 may reduce stress generated by the inorganic layer 320. Although particles may be disposed on the inorganic layer 320, the inorganic layer 320 may be substantially flatly covered.

A thickness of the organic layers 310 and 330 may be in a range of from about 100 Å to about 50,000 Å, for example, from about 1,000 Å to about 10,000 Å. When the thickness of the organic layers 310 and 330 is within this range, a lower part of the organic layers 310 and 330 may be sufficiently planarized. When the number of organic layers is two or greater, thicknesses of the at least two organic layers may be substantially the same as or different from each other.

According to an exemplary embodiment of the present invention, the organic layers 310 and 330 may be thicker than the inorganic layers 320 and 340, respectively.

The organic layers 310 and 330 may include a cured product. The cured product may be a composition for forming an organic layer. The composition may include a first photocurable monomer. For example, the organic layers 310 and 330 may include a polymer. The polymer may be formed by exposing the composition for forming an organic layer including a first photocurable monomer to light.

The first photocurable monomer may include a photocurable functional group. According to an exemplary embodiment of the present invention, the first photocurable monomer may include at least one photocurable functional group. For example, the photocurable functional group may be selected from a vinyl group, an acrylate group, an epoxy group, and a methacrylate group; however, exemplary embodiments of the present invention are not limited thereto.

For example, the first photocurable monomer may be selected from ethylenegylcol di(meth)acrylate, hexanediol di(meth)acrylate, heptanediol di(meth)acrylate, octanediol di(meth)acrylate, nonanediol di(meth)acrylate, decanediol di(meth)acrylate, triethylpropane tri(meth)acrylate, pentaerythritol tri(meth)acrylate, pentaerythritol tetra(meth)acrylate, dipentarythritol tri(meth)acrylate, dipentarythritol tetra(meth)acrylate, dipentarythritol penta(meth)acrylate, dipentarythritol hexa(meth)acrylate, and any combination thereof; however, exemplary embodiments of the present invention are not limited thereto.

According to an exemplary embodiment of the present invention, the composition for forming an organic layer may include a photoinitiator. The photoinitiator may be selected from materials that may initiate a curing reaction of the composition for forming an organic layer.

For example, the photoinitiator may be selected from a benzophenone-based compound, an oxime-based compound, and a phosphine oxide-based compound; however, exemplary embodiments of the present invention are not limited thereto.

Examples of the benzophenone-based compound may include 2-hydroxy-2-methyl-1-phenyl-1-propanone, 2-hydroxy-1-[4-(2-hydroxyethoxy)phenyl]-2-methyl-1-propanone, alpha-dimethoxy-alpha-phenylacetophenone, 2-benzyl-2-(dimethylamino)-1-[4-(4-morpholinyl) phenyl]-1-butanone, or 2-methyl-1-[4-(methylthio)phenyl]-2-(4-morpholinyl)-1-propanone.

Examples of the oxime-based compound may include (hydroxyimino)cyclohexane, 1-[4-(phenylthio)phenl]-octane-1,2-dione-2-(O-benzoyloxime), 1[-9-ethyl-6-(2-methylbenzoyl)-9H-carbazol-3-yl]-ethanone-1-(O-acetyloxime), trichloromethyl-1,3,5-triazine derivatives, 4-(4-methoxystyryl)-2,6-trichloromethyl-1,3,5-triazine, 4-(4-methoxyphenyl)-2,6-trichloromethyl-1,3,5-triazine, or ∝-aminoketone (1-(4-morpholinophenyl)-2-dimethylamino-2-benzyl-butan-1-one.

Examples of the phosphine oxide-based compound may include diphenyl (2,4,6-trimethylbenzoyl)-phosphine oxide (TPO), or phenyl bis(2,4,6-trimethyl benzoyl) phosphine oxide (BAPO).

An amount of the photoinitiator may be selected based on materials that may initiate a curing reaction of the first photocurable monomer.

Referring to FIG. 1, the buffer layer 400 may be formed on the sealing layer 300. The buffer layer 400 and the sealing layer 300 may reduce or prevent penetration of water and oxygen from the outside to the display unit 200. The buffer layer 400 and the sealing layer 300 may increase a sensitivity of touch by providing a substantially constant distance between the counter electrode 233 and the touch screen layer 500.

The buffer layer 400 may include a cured product of a composition for forming a buffer layer. The composition may include a second photocurable monomer and a third photocurable monomer. For example, the buffer layer 400 may include a polymer that is formed by exposing the composition for forming a buffer layer including a second photocurable monomer and a third photocurable monomer to light.

The second photocurable monomer may include a photocurable functional group. According to an exemplary embodiment of the present invention, the second photocurable monomer may include at least four photocurable functional groups. When a composition for forming a buffer layer including the second photocurable monomer, which includes at least four photocurable functional groups, is used to form the buffer layer 400, the composition for forming a buffer layer may be cured by exposure to light under a condition of atmospheric pressure. Thus, a preparation process may be simplified.

According to an exemplary embodiment of the present invention, the photocurable functional group may be selected from a vinyl group, an acrylate group, an epoxy group, and a methacrylate group; however, exemplary embodiments of the present invention are not limited thereto.

For example, the second photocurable monomer may be selected from pentaerythritol tetra(meth)acrylate, dipentarythritol tetra(meth)acrylate, dipentarythritol penta(meth)acrylate, dipentarythritol hexa(meth)acrylate, and any combination thereof; however, exemplary embodiments of the present invention are not limited thereto.

According to an exemplary embodiment of the present invention, the first photocurable monomer and the second photocurable monomer may be different from each other.

The third photocurable monomer may be selected from compounds represented by Formulae 1A to 1C:

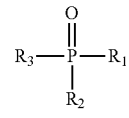

<Formula 1A>

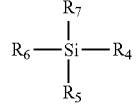

<Formula 1B>

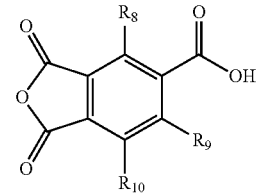

<Formula 1C>

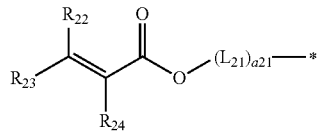

<Formula 2>

<Formula 3>

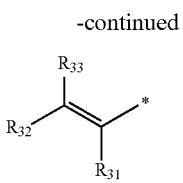

In Formulae 1A to 1C, 2, and 3:

$R_1$ to $R_{10}$ may each independently be selected from a group represented by Formula 2, a group represented by Formula 3, hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$), and $R_{22}$ to $R_{24}$, and $R_{31}$ to $R_{33}$ may each independently be selected from hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$).

According to an exemplary embodiment of the present invention, $R_1$ to $R_{10}$ may each independently be selected from:

A group represented by Formula 2, a group represented by Formula 3, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, and a $C_1$-$C_{60}$ alkoxy group; and a $C_1$-$C_{60}$ alkyl group and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, or a $C_1$-$C_{60}$ alkoxy group.

According to an exemplary embodiment of the present invention, in Formula 1A, at least one of $R_1$ to $R_3$ may be selected from a group represented by Formula 2 and a group represented by Formula 3. In Formula 1B, at least one of $R_4$ to $R_7$ may be selected from a group represented by Formula 2 and a group represented by Formula 3. In Formula 1C, at least one of $R_8$ to $R_{10}$ may be selected from a group represented by Formula 2 and a group represented by Formula 3.

According to an exemplary embodiment of the present invention, $R_{22}$ to $R_{24}$ and $R_{31}$ to $R_{33}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group; and a $C_1$-$C_{60}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group.

In Formula 2, $L_{21}$ may be selected from *—$R_{21}$O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group. $R_{21}$ may be a substituted or unsubstituted $C_1$-$C_{60}$ alkylene group.

According to an exemplary embodiment of the present invention, $L_{21}$ in Formula 2 may be selected from:

*—$R_{21}$O—*', and a $C_1$-$C_{10}$ alkylene group; and a $C_1$-$C_{10}$ alkylene group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group.

$R_{21}$ in Formula 2 may be a $C_1$-$C_{10}$ alkylene group.

In Formula 2, a21 may be an integer selected from 0 to 3. In Formula 2, a21 may indicate the number of $L_{21}$s. When a21 is 0, *—($L_{21}$)$_{a21}$—*', may be a single bond. According to an exemplary embodiment of the present invention, a21 may be an integer selected from 0 and 1; however, exemplary embodiments of the present invention are not limited thereto.

In Formulae 1A to 1C, 2, and 3, * and *' are may each indicate a binding site to a neighboring atom.

According to an exemplary embodiment of the present invention, the third photocurable monomer may be represented by one of Formulae 1A-1, 1A-2, 1B-1, 1B-2, and 1C-1; however, exemplary embodiments of the present invention are not limited thereto:

<Formula 1A-1>

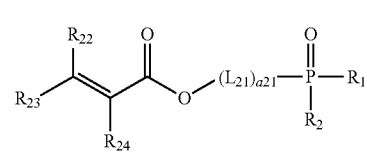

<Formula 1A-2>

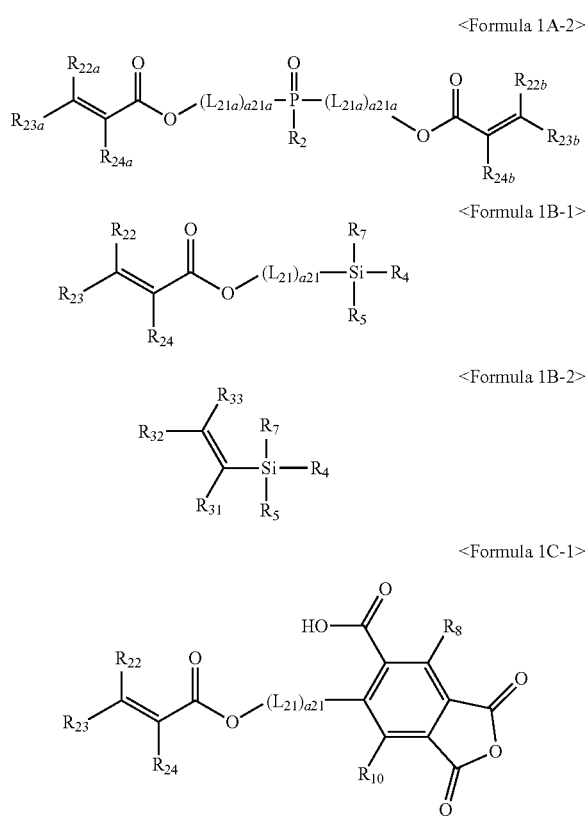

<Formula 1B-1>

<Formula 1B-2>

<Formula 1C-1>

In Formulae 1A-1, 1A-2, 1B-1, 1B-2, and 1C-1:

$L_{21}$, a21, $R_1$, $R_2$, $R_4$, $R_5$, $R_7$, $R_8$, $R_{10}$, $R_{22}$ to $R_{24}$, and $R_{31}$ to $R_{33}$ may be the same as described above, $L_{21a}$ and $L_{21b}$ may be the same as $L_{21}$, a21a and a21b may be the same as a21, $R_{22a}$ and $R_{22b}$ may be the same as $R_{22}$, $R_{23a}$ and $R_{23b}$ may be the same as $R_{23}$, and $R_{24a}$ and $R_{24b}$ may be the same as $R_{24}$.

The third photocurable monomer may be selected from Compounds 1 to 6; however, exemplary embodiments of the present invention are not limited thereto:

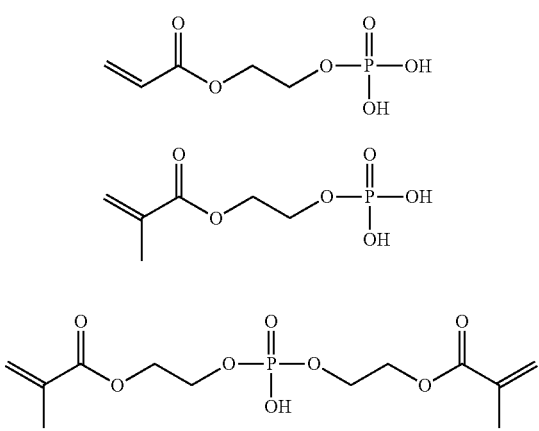

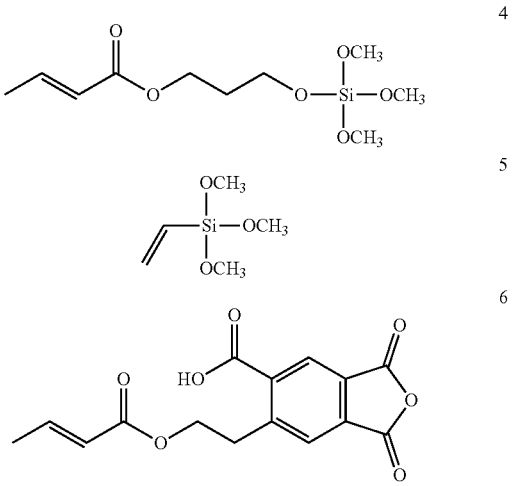

The third photocurable monomer may include at least one moiety represented by Formulae 1A to 1C. The at least one moiety represented by Formulae 1A to 1C may be a phosphate-based, silane-based, or carboxyl-based moiety. The at least one moiety may increase binding strength of a cured product. The third photocurable monomer may include a moiety represented by Formula 2 or Formula 3. The moiety represented by Formula 2 or Formula 3 may be a photocurable functional group. The photocurable functional group may form a cross-linking bond. The cross-linking bond may be formed through light-exposure.

The composition for forming a buffer layer, in which the composition includes the third photocurable monomer, may be exposed to light. Thus, a cross-linking bond may form a buffer layer. Thus, a binding strength of the composition to the sealing layer may increase.

When the organic layers 310 and 330 of the sealing unit include a cured product of the composition including the third photocurable monomer, manufacture of the organic layers 310 and 330 might not be easy due to gas generated during formation of the organic layers 310 and 330 and the generated gas influenced the display unit. Thus, a decrease in a lifespan of the display apparatus may occur.

When the buffer layer 400 includes a cured product of the composition for forming a buffer layer including the second photocurable monomer, a binding strength to the sealing layer may decrease. Thus, a separation between the buffer layer 400 and the sealing layer 300 may occur.

The composition for forming a buffer layer may include a photoinitiator. An amount of the photoinitiator may be within a range at which a curing reaction of the second photocurable monomer and the third photocurable monomer may be initiated. A type of the photoinitiator may be the same as described herein.

A touch screen layer 500 may be formed on the buffer layer 400. According to an exemplary embodiment of the present invention, a cover layer 600 may be formed on the touch screen layer 500. The cover layer 600 may protect the touch screen layer 500.

For example, the touch screen layer 500 may be an electrostatic capacity type touch screen. When the cover layer 600 is touched, an electrostatic capacity between sensing patterns 510 and 520 (see, e.g., FIG. 3) of the touch screen layer 500 and the counter electrode 233 may change. When the change in the electrostatic capacity is detected, the corresponding portion may be determined as it is contacted.

A touch screen according to an exemplary embodiment of the present invention will be described in more detail below with reference to FIGS. 3 and 4.

Figure 3:
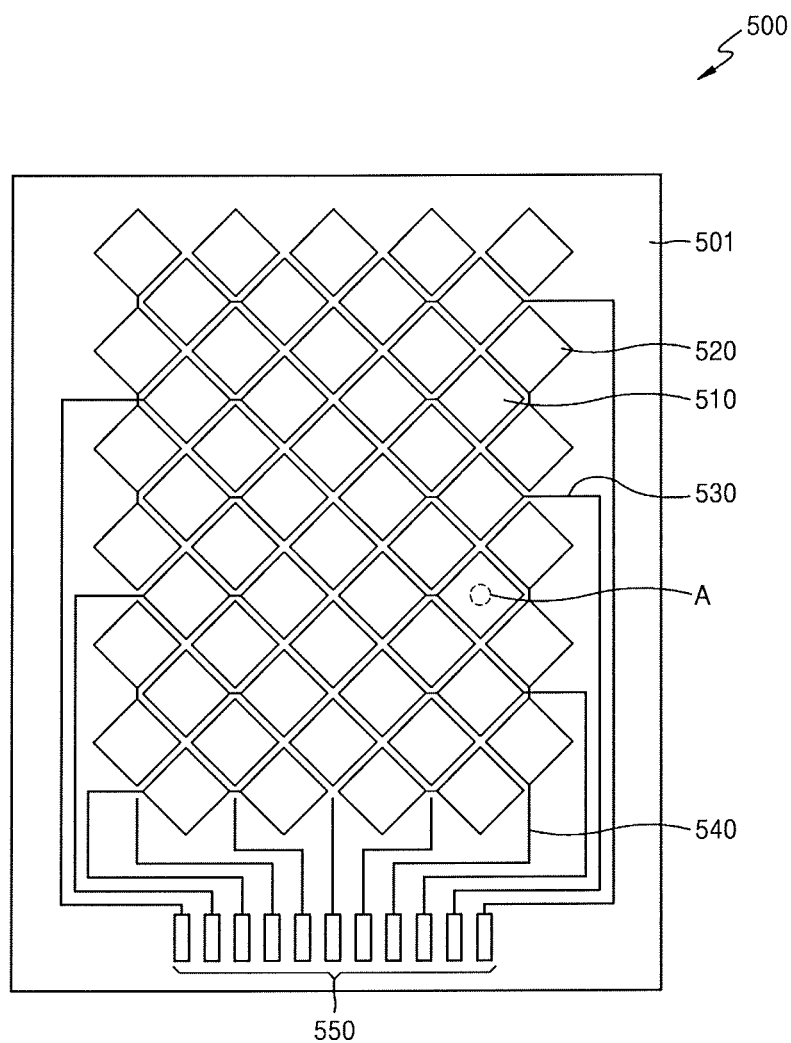
FIG. 3 is a schematic cross-sectional view illustrating a structure of a touch screen layer of a display apparatus of FIG. 1 according to an exemplary embodiment of the present invention.

FIG. 3 is a schematic cross-sectional view illustrating a structure of a touch screen of the display apparatus of FIG. 1 according to an exemplary embodiment of the present invention. FIG. 4 is an enlarged cross-sectional view of a portion A of FIG. 3 according to an exemplary embodiment of the present invention.

Figure 4:
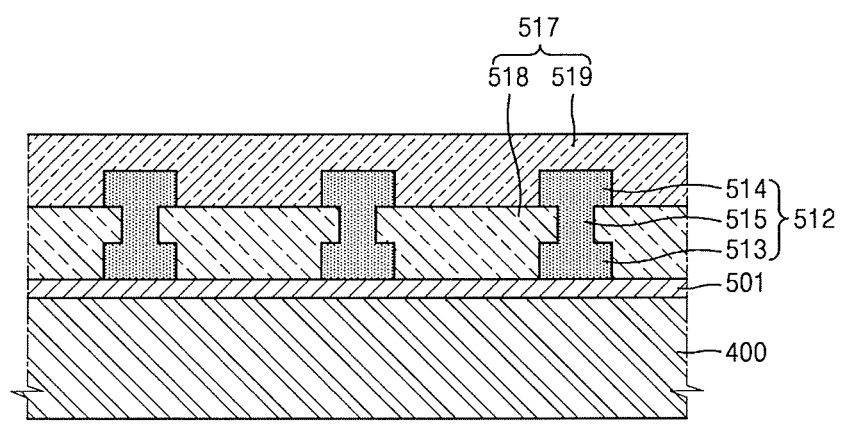
FIG. 4 is an enlarged cross-sectional view illustrating a portion A of FIG. 3 according to an exemplary embodiment of the present invention.

Referring to FIGS. 3 and 4, the touch screen layer 500 may include a plurality of first sensing patterns 510, a plurality of second sensing patterns 520, and a pad unit 550. The plurality of first sensing patterns 510 may be arranged in a first direction. The plurality of second sensing patterns 520 may be arranged in a second direction. The second direction may be different than the first direction. The pad unit 550 may be electrically connected to the plurality of first sensing patterns 510. The pad unit 550 may be electrically connected to the plurality of second sensing patterns 520. The plurality of first sensing patterns 510 and the pad unit 550 may be connected to each other via first connecting parts 530. The plurality of second sensing patterns 520 and the pad unit 550 may be connected to each other via second connecting parts 540.

The plurality of first sensing patterns 510 and the plurality of second sensing patterns 520 may be electrically insulated to each other. The plurality of second sensing patterns 520 and the plurality of first sensing patterns 510 may be alternatingly arranged. According to an exemplary embodiment of the present invention, the second direction in which the plurality of second sensing patterns 520 is arranged may be substantially perpendicular to the first direction in which the plurality of first sensing patterns 510 is arranged.

The plurality of first sensing patterns 510, the plurality of second sensing patterns 520, and the counter electrode 233 may form one capacitor. As an example, when a user touches the cover layer 600, the plurality of first sensing patterns 510 and the plurality of second sensing patterns 520 with an external touch input unit may form a capacitor. When two capacitors are connected in series by the touch of the user, a change in an electrostatic capacity may occur. Thus, a location at which the change in an electrostatic capacity occurred and a magnitude of the change may be detected. Thus, a touch panel function may be activated.

Each of the plurality of first sensing patterns 510 and the plurality of second sensing patterns 520 may include metal wires 512. According to an exemplary embodiment of the present invention, the plurality of first sensing patterns 510 and the plurality of second sensing patterns 520 may be formed in a net pattern. However, exemplary embodiments of the present invention are not limited thereto. The net pattern may include repeated shapes of triangles or polygons. The repeated shapes of the net pattern may be formed by the metal wires 512.

The metal wires 512 may include at least one selected from copper, aluminum, molybdenum, and silver, which may have a relatively high conductivity. According to an exemplary embodiment of the present invention, a base film 501 may be formed on the thin film sealing layer 400. The base film 501 may be formed on the thin film sealing layer 400 by vapor deposition. The base film 501 may include an inorganic material.

When the plurality of first sensing patterns 510 and the plurality of second sensing patterns 520 are formed in a lattice pattern, flexibility of the plurality of first sensing patterns 510 and the plurality of second sensing patterns 520 may increase. Thus, when the touch screen layer 500 is curved to have a relatively small curvature, an occurrence of cracks in the plurality of first sensing patterns 510 and the plurality of second sensing patterns 520 may be reduced or eliminated.

Due to the lattice pattern, the plurality of first sensing patterns 510 and the plurality of second sensing patterns 520 may have a relatively high light transmittance. Thus, the plurality of first sensing patterns 510 and the plurality of second sensing patterns 520 may include a metal, which may have a relatively high conductivity as compared to a transmissive electrode, such as ITO. Thus, the change in an electrostatic capacity may be relatively quickly delivered to a driving circuit, which may increase a response rate of the touch screen layer 500.

Since the base film 501 may be directly formed on the sealing layer 300 by vapor deposition, and the plurality of first sensing patterns 510 and the plurality of second sensing patterns 520 may be directly formed on the base film 501, an adhesion layer for attaching the touch screen layer 400 to the sealing layer 300 might be omitted. Thus, a thickness of a display apparatus 10 may be reduced. Thus, a flexibility of the display apparatus 10 may increase.

The metal wires 512 may each have substantially the same pattern as each other. The metal wires 512 may each include a first layer 513 and a second layer 514. The first layer 513 and the second layer 514 may be electrically connected to each other. The first layer 513 and the second layer 514 may be connected to each other via an interlayer 515. Thus, a resistance of the plurality of first sensing patterns 510 and the plurality of second sensing patterns 520 may decrease. Thus, a response rate of the touch screen layer 500 may increase.

The plurality of first sensing patterns 510 and the plurality of second sensing patterns 520 may be disposed on substantially the same plane. At intersections of the plurality of first sensing patterns 510 and the plurality of second sensing patterns 520, the plurality of first sensing patterns 510 may be connected to each other via the first layer 513 or the second layer 514. The plurality of second sensing patterns 520 may be connected to each other via the second layer 514 or the first layer 513.

For example, when a pair of the first sensing patterns 510 adjacent to each other and arranged in the first direction are connected to each other via the first layer 513, the second layer 514 disposed between the pair of the first sensing patterns 510 may be removed. Additionally, when a pair of the second sensing patterns 520 adjacent to each other and arranged in the second direction substantially perpendicular to the first direction are connected to each other via the second layer 514, the first layer 513 disposed between the pair of the second sensing patterns 520 may be removed.

Thus, a bridge electrode at intersections of the plurality of first sensing patterns 510 and the plurality of second sensing patterns 520 as a detour connecting the neighboring first sensing patterns 510 or the neighboring second sensing patterns 520 may be omitted. Thus, a manufacturing process of the touch screen layer 500 may be simplified.

The touch screen layer 500 may include an insulating layer 517. The insulating layer 517 may cover the plurality of first sensing patterns 510 and the plurality of second sensing patterns 520. The insulating layer 517 may insulate the plurality of first sensing patterns 510 and the plurality of second sensing patterns 520 from each other. The insulating layer 517 may prevent exposing the plurality of first sensing patterns 510 and the plurality of second sensing patterns 520 to the outside. The insulating layer 517 may include an organic material or an inorganic material.

The insulating layer 517 may include a first insulating layer 518. The first insulating layer 518 may cover the first layer 513. The insulating layer 517 may include a second insulating layer 519. The second insulating layer 519 may be configured to cover the second layer 514. A via hole may be formed in the first insulating layer 518. An interlayer 515 may be formed in the via hole. that the interlayer 515 may electrically connect the first layer 513 and the second layer 514.

According to an exemplary embodiment of the present invention, the first insulating layer 518 and the second insulating layer 519 may include an inorganic material. When the insulating layer 517 seals the base film 501 including an inorganic material and the metal wires 512, penetration of water and oxygen from the outside may be reduced or eliminated. The inorganic material may include at least one selected from a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon nitrate; however, exemplary embodiments of the present invention are not limited thereto.

According to an exemplary embodiment of the present invention, the first insulating layer 518 and the second insulating layer 519 may include an organic material. Thus, a flexibility of the insulating layer 517 may increase. The organic material may include at least one selected from an acryl-based resin, a methacryl-based resin, polyisoprene, a vinyl-based resin, an epoxy-based resin, a urethane-based resin, a cellulose-based resin, and a perylene-based resin; however, exemplary embodiments of the present invention are not limited thereto.

According to an exemplary embodiment of the present invention, the first insulating layer 518 may include an inorganic material. The second insulating layer 519 disposed on the first insulating layer 518 may include an organic material. Thus, a binding strength between the base film 501 including an inorganic material and the insulating layer 517 may be relatively high. Additionally, a flexibility of the insulating layer 517 may increase.

The cover layer 600 disposed on the touch screen layer 500 may have flexibility. The cover layer 600 may include polymethyl methacrylate, polydimethylsiloxane, polyimide, acrylate, polyethylen terephthalate, or polyethylen naphthalate. However, exemplary embodiments of the present invention are not limited thereto, and various materials such as a metal or a thin metal foil such as steel use stainless (SUS) may be included in the cover layer 600.

A method of manufacturing a display apparatus according to an exemplary embodiment of the present invention will be described in more detail below.

A method of manufacturing a display apparatus may include preparing a substrate. A display unit may be formed on the substrate. A sealing layer may be formed. The sealing layer may cover the display unit. The sealing layer may include n sealing units, in which n is an integer of 1 or greater. Each of the n sealing units may include an organic layer and an inorganic layer. The organic layer and the inorganic layer may be sequentially stacked on the display unit. A buffer layer may be formed on the sealing layer. A touch screen layer may be formed on the buffer layer. The organic layer of one of the sealing units may include a cured product. The cured product may be of a composition for forming an organic layer. The composition for forming the organic layer may include a first photocurable monomer. The buffer layer may include a cured product. The cured product may be of a composition for forming a buffer layer.

The composition for forming the buffer layer may include a second photocurable monomer and a third photocurable monomer. The first photocurable monomer, the second photocurable monomer, and the photocurable monomer may be substantially the same as described herein.

The display unit may be formed on the substrate.

According to an exemplary embodiment of the present invention, the sealing layer may be formed by providing the composition for forming an organic layer to a region where the organic layer is to be formed on the display unit; and forming an organic layer by exposing the composition for forming an organic layer to light.

The composition for forming an organic layer may be formed by, for example, screen printing, flash evaporation, spin coating, dip coating, or inkjet printing; however, exemplary embodiments of the present invention are not limited thereto.

The organic layer may be formed by exposing the composition for forming an organic layer to light. The organic layer may be formed by, for example, UV curing, IR curing, or laser curing; however, exemplary embodiments of the present invention are not limited thereto.

The composition for forming an organic layer and a thickness of the organic layer may be the same as described herein.

According to an exemplary embodiment of the present invention, the sealing layer may be formed by forming an inorganic layer by using a reactive sputtering method or a chemical vapor deposition (CVD) method with oxygen gas or oxygen plasma on the organic layer. A material and a thickness of the inorganic layer may be the same as described herein.

The touch screen layer may be formed by forming a plurality of first sensing patterns and a plurality of second sensing patterns on the buffer layer; and forming an insulating layer on the plurality of first sensing patterns and the plurality of second sensing patterns.

According to an exemplary embodiment of the present invention, the touch screen layer may be formed by patterning a metal wire on the buffer layer; and forming an insulating layer on the metal wire.

According to an exemplary embodiment of the present invention, the metal wires may be formed on the buffer layer by printing or imprinting. According to an exemplary embodiment of the present invention, the metal wires may be formed by vapor depositing a metal material on the buffer layer and etching the metal material to form patterns.

Prior to forming the touch screen on the buffer layer, a protection film may be formed on the buffer layer The protection film may be removed. After forming the buffer layer on the sealing layer and prior to forming the touch screen layer on the buffer layer, the protection film may be formed on the buffer layer. The protection film may reduce or eliminate a penetration of water and oxygen from the outside to the buffer layer and the sealing layer.

The protection film may be removed to form the touch screen layer on the buffer layer. The buffer layer may have a relatively high binding strength to the sealing layer. The buffer layer may include a cured product of a composition for forming a buffer layer. The composition may include the third photocurable monomer. Thus, the buffer layer and the sealing layer might not be separated when the protection film is removed. Thus, a touch screen formation process and process thereafter may be performed without separate process. Thus, the manufacturing process of a display apparatus according to an exemplary embodiment of the present invention may be simplified and a manufacturing cost thereof may be reduced.

According to an exemplary embodiment of the present invention, a cover layer may be formed on the touch screen layer.

The term "$C_1$-$C_{60}$ alkyl group" as used herein refers to a linear or branched aliphatic hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an iso-amyl group, or a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof may include a methoxy group, an ethoxy group, or an isopropyloxy group.

The term "$C_2$-$C_{60}$ alkenyl group" as used herein refers to a hydrocarbon group formed by substituting at least one carbon double bond in the middle or at the terminal of the $C_2$-$C_{60}$ alkyl group, and non-limiting examples thereof may include an ethenyl group, a propenyl group, or a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon triple bond in the middle or at the terminal of the $C_2$-$C_{60}$ alkyl group, and non-limiting examples thereof may include an ethynyl group, or a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent hydrocarbon monocyclic group having 3 to 10 carbon atoms, and non-limiting examples thereof may include a cyclopropyl group, a cyclobutyl group, a cyclopentyl group, a cyclohexyl group, or a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent monocyclic group having at least one heteroatom selected from N, O, P, Si and S as a ring-forming atom and 2 to 10 carbon atoms, and non-limiting examples thereof may include a tetrahydrofuranyl group or a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof and does not have aromaticity, and non-limiting examples thereof may include a cyclopentenyl group, a cyclohexenyl group, or a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom selected from N, O, P, Si, and S as a ring-forming atom, 2 to 10 carbon atoms, and at least one double bond in its ring. Non-limiting examples of the $C_2$-$C_{10}$ heterocycloalkenyl group may include a 2,3-hydrofuranyl group or a 2,3-hydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, or a chrysenyl group. When the $C_6$-$C_{60}$ aryl group and the $C_6$-$C_{60}$ arylene group each include two or more rings, the rings may be chemically bonded to each other.

The term "$C_2$-$C_{60}$ heteroaryl group" as used herein refers to a monovalent group having a carbocyclic aromatic system that has at least one heteroatom selected from N, O, P, Si, and S as a ring-forming atom, and 2 to 60 carbon atoms. The term "$C_2$-$C_{60}$ heteroarylene group" as used herein refers to a divalent group having a carbocyclic aromatic system that has at least one heteroatom selected from N, O, P, and S as a ring-forming atom, and 2 to 60 carbon atoms. Non-limiting examples of the $C_2$-$C_{60}$ heteroaryl group may include a pyridinyl group, a pyrimidinyl group, a pyrazinyl group, a pyridazinyl group, a triazinyl group, a quinolinyl group, or an isoquinolinyl group. When the $C_2$-$C_{60}$ heteroaryl group and the $C_2$-$C_{60}$ heteroarylene group each include two or more rings, the rings may be chemically bonded to each other.

The term "$C_6$-$C_{60}$ aryloxy group" as used herein refers to —$OA_{102}$, in which $A_{102}$ is the $C_6$-$C_{60}$ aryl group. The term "$C_6$-$C_{60}$ arylthio group" as used herein indicates $SA_{103}$, in which $A_{103}$ is the $C_6$-$C_{60}$ aryl group.

The term "monovalent non-aromatic condensed polycyclic group" as used herein refers to a monovalent group. The monovalent group may have two or more rings condensed to each other. The monovalent group might only have carbon atoms (e.g., the number of carbon atoms may be in a range of 8 to 60) as a ring forming atom. The entire molecular structure may have non-aromaticity. Non-limiting examples of the monovalent non-aromatic condensed polycyclic group may include a fluorenyl group. The term "divalent non-aromatic condensed polycyclic group" used herein refers to a divalent group having the same structure as the monovalent non-aromatic condensed polycyclic group.

The term "monovalent non-aromatic condensed heteropolycyclic group" as used herein refers to a monovalent group. The monovalent group may have two or more rings condensed to each other. The monovalent group has a heteroatom selected from N, O, P, Si, and S, other than carbon atoms (e.g., the number of carbon atoms may be in a range of 2 to 60) as a ring forming atom. The entire molecular structure may have non-aromaticity. Non-limiting examples of the monovalent non-aromatic condensed heteropolycyclic group may include a carbazolyl group. The term "divalent non-aromatic condensed heteropolycyclic group" used herein refers to a divalent group having the same structure as the monovalent non-aromatic condensed heteropolycyclic group.

At least one substituent of the substituted $C_1$-$C_{60}$ alkylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group may be selected from:

deuterium, –F, –Cl, –Br, –I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic heterocondensed polycyclic group.

$Q_1$ to $Q_3$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

It should be understood that exemplary embodiments of the present invention described herein should be considered in a descriptive sense only and not for purposes of limitation. Descriptions of features or aspects within each exemplary embodiment of the present invention should typically be considered as available for other similar features or aspects in other exemplary embodiments of the present invention.

While one or more exemplary embodiments of the present invention have been described with reference to the figures, it will be understood by those of ordinary skill in the art that various changes in form and details may be made therein without departing from the spirit and scope of the present invention.

What is claimed is:

1. A display apparatus, comprising:
a substrate;
a display unit disposed on the substrate;
a sealing layer disposed on the display unit;
a touch screen layer disposed on the sealing layer; and
a buffer layer disposed between the sealing layer and the touch screen layer,
wherein the sealing layer comprises n sealing units that each comprise an organic layer and an inorganic layer that are sequentially stacked on the display unit, and n is an integer of 1 or greater,
the organic layer of the sealing unit comprises a cured product for forming an organic layer comprising a first photocurable monomer,
the buffer layer comprises a cured product for forming a buffer layer comprising a second photocurable monomer and a third photocurable monomer, the first photocurable monomer and the second photocurable monomer comprise a photocurable functional group, and
the third photocurable monomer is selected from compounds represented by Formulae 1A to 1C:

<Formula 1A>
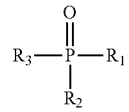

<Formula 1B>
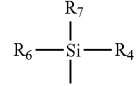

<Formula 1C>
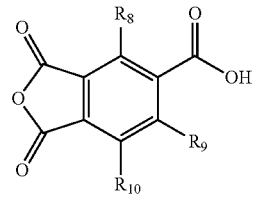

<Formula 2>
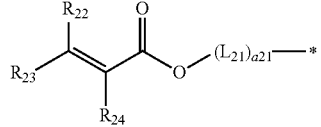

<Formula 3>
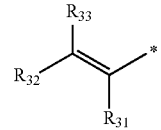

wherein, in Formulae 1A to 1C, 2, and 3,
$R_1$ to $R_{10}$ are each independently selected from a group represented by Formula 2, a group represented by Formula 3, hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);
$R_{22}$ to $R_{24}$, and $R_{31}$ to $R_{33}$ are each independently selected from hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);

$L_{21}$ is selected from *—$R_{21}$O—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;

$R_{21}$ is a substituted or unsubstituted $C_1$-$C_{60}$ alkylene group;

a21 is an integer selected from 0 to 3;

* and *' each indicate a binding site to a neighboring atom; and at least one substituent of the substituted $C_1$-$C_{60}$ alkylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic hetero-condensed polycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group, wherein $Q_1$ to $Q_3$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group.

2. The display apparatus of claim 1, wherein the first photocurable monomer comprises at least one photocurable functional group, and the second photocurable monomer comprises at least four photocurable functional groups.

3. The display apparatus of claim 1, wherein the first photocurable monomer is selected from ethylenegylcol di(meth)acrylate, gylcol di(meth)acrylate, hexanediol di(meth)acrylate, heptanediol di(meth)acrylate, octanediol di(meth)acrylate, nonanediol di(meth)acrylate, decanediol di(meth)acrylate, triethylpropane tri(meth)acrylate, pentaerythritol tri(meth)acrylate, pentaerythritol tetra(meth)acrylate, dipentarythritol tri(meth)acrylate, dipentarythritol tetra(meth)acrylate, dipentarythritol penta(meth)acrylate, dipentarythritol hexa(meth)acrylate, and any combination thereof.

4. The display apparatus of claim 1, wherein the second photocurable monomer is selected from pentaerythritol tetra(meth)acrylate, dipentarythritol tetra(meth)acrylate, dipentarythritol penta(meth)acrylate, dipentarythritol hexa(meth)acrylate, and any combination thereof.

5. The display apparatus of claim 1, wherein $R_1$ to $R_{10}$ are each independently selected from a group represented by Formula 2, a group represented by Formula 3, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, and a $C_1$-$C_{60}$ alkoxy group; or a $C_1$-$C_{60}$ alkyl group and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, and a $C_1$-$C_{60}$ alkoxy group.

6. The display apparatus of claim 1, wherein $R_{22}$ to $R_{24}$ and $R_{31}$ to $R_{33}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group; and a $C_1$-$C_{60}$ alkyl group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group.

7. The display apparatus of claim 1, wherein $L_{21}$ is *—$R_{21}$O—*' and selected from:

a $C_1$-$C_{10}$ alkylene group; and a $C_1$-$C_{10}$ alkylene group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group, and $R_{21}$ is a $C_1$-$C_{10}$ alkylene group.

8. The display apparatus of claim 1, wherein the third photocurable monomer is represented by one of Formulae 1A-1, 1A-2, 1B-1, 1B-2, and 1C-1:

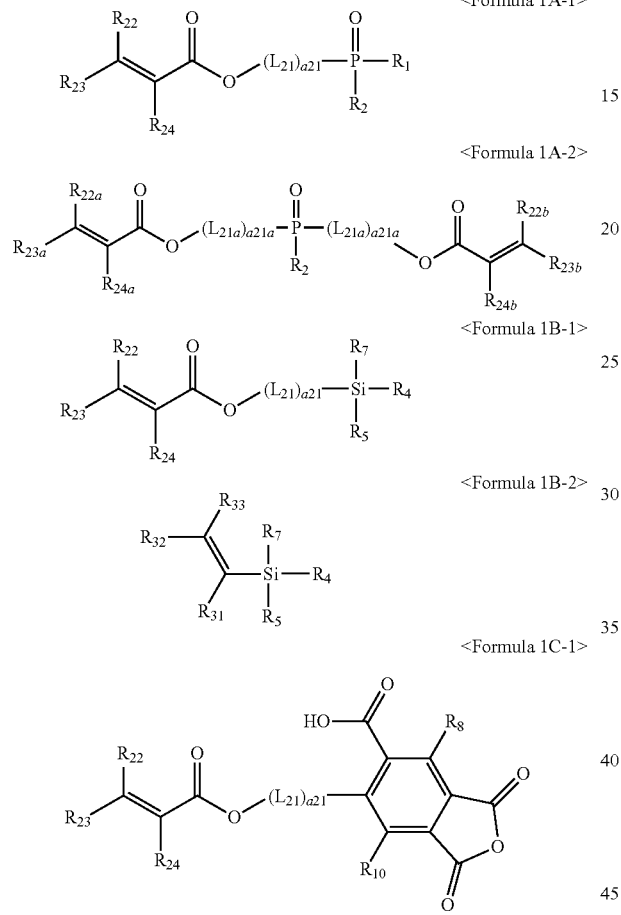

wherein, in Formulae 1A-1, 1A-2, 1B-1, 1B-2, and 1C-1, $L_{21}$, a21, $R_1$, $R_2$, $R_4$, $R_5$, $R_7$, $R_8$, $R_{10}$, $R_{22}$ to $R_{24}$, and $R_{31}$ to $R_{33}$ are the same as in claim 1, $L_{21a}$ and $L_{21b}$ are the same as $L_{21}$ in claim 1, a21a and a21b are the same as a21 in claim 1, $R_{22a}$ and $R_{22b}$ are the same as $R_{22}$ in claim 1, $R_{23a}$ and $R_{23b}$ are the same as $R_{23}$ in claim 1, and $R_{24a}$ and $R_{24b}$ are the same as $R_{24}$ in claim 1.

9. The display apparatus of claim 1, wherein the third photocurable monomer is selected from Compounds 1 to 6:

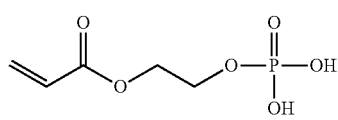

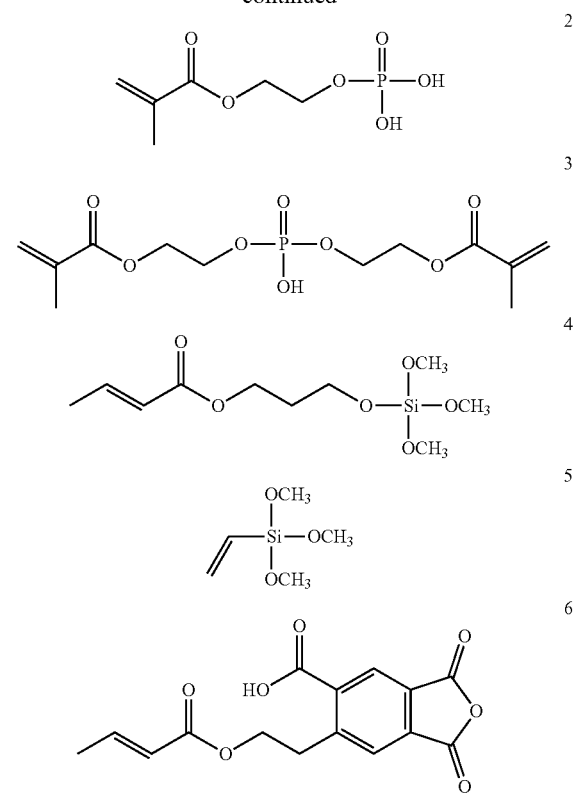

10. The display apparatus of claim 1, wherein the inorganic layer comprises a metal, a metal nitride, a metal oxide, a metal nitrate, a metal carbide, or any combination thereof.

11. The display apparatus of claim 1, wherein the touch screen layer comprises a plurality of first sensing patterns, a plurality of second sensing patterns, and an insulating layer, wherein the insulating layer covers the plurality of first sensing patterns and the plurality of second sensing patterns.

12. The display apparatus of claim 11, wherein the plurality of first sensing patterns and the plurality of second sensing patterns each independently comprise a metal wire.

13. The display apparatus of claim 1, further comprising a cover layer disposed on the touch screen layer.

14. The display apparatus of claim 1, wherein the display unit comprises a thin film transistor and an organic light-emitting device (OLED).

15. A method of manufacturing a display apparatus, the method comprising:
providing a substrate;
forming a display unit on the substrate;
forming a sealing layer on the display unit, the sealing layer comprising n sealing units that each comprise an organic layer and an inorganic layer that are sequentially stacked on the display unit, wherein n is an integer of 1 or greater;
forming a buffer layer on the sealing layer; and
forming a touch screen layer on the buffer layer,
wherein the organic layer of at least one of the sealing units comprises a cured product for forming an organic layer, wherein the cured product for forming the organic layer comprises a first photocurable monomer, the buffer layer comprises a cured product of a composition for forming a buffer layer, wherein the cured product for forming the buffer layer comprises a second photocurable monomer and a third photocurable monomer, the first photocurable monomer and the second photocurable monomer each comprise a photocurable functional group, and
the third photocurable monomer is selected from compounds represented by Formulae 1A to 1C:

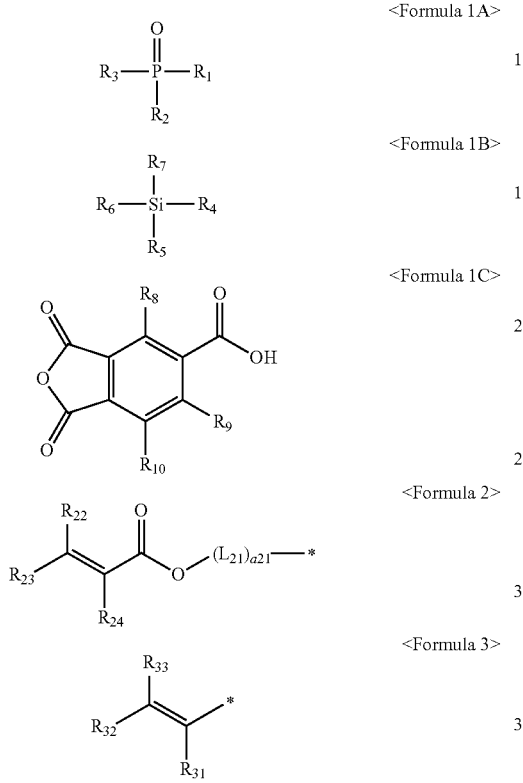

<Formula 1A>

<Formula 1B>

<Formula 1C>

<Formula 2>

<Formula 3> wherein, in Formulae 1A to 1C, 2, and 3,
$R_1$ to $R_{10}$ are each independently selected from a group represented by Formula 2, a group represented by Formula 3, hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);
$R_{22}$ to $R_{24}$, and $R_{31}$ to $R_{33}$ are each independently selected from hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic hetero-condensed polycyclic group, and —Si($Q_1$)($Q_2$)($Q_3$);
$L_{21}$ is selected from *—$R_{21}$—*', a substituted or unsubstituted $C_1$-$C_{60}$ alkylene group, a substituted or unsubstituted $C_3$-$C_{10}$ cycloalkylene group, a substituted or unsubstituted $C_2$-$C_{60}$ alkenylene group, a substituted or unsubstituted $C_3$-$C_{10}$ cycloalkenylene group, and a substituted or unsubstituted $C_6$-$C_{60}$ arylene group;
$R_{21}$ is a substituted or unsubstituted $C_1$-$C_{60}$ alkylene group;
a21 is an integer selected from 0 to 3;
* and *' each indicate a binding site to a neighboring atom; and
at least one substituent of the substituted $C_1$-$C_{60}$ alkylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic hetero-condensed polycyclic group is selected from:
deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; and
a $C_3$-$C_{10}$ cycloalkyl group, a $C_1$-$C_{10}$ heterocycloalkyl group, a $C_3$-$C_{io}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group,
wherein $Q_1$ to $Q_3$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_{10}$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group.

16. The method of claim 15, wherein the forming of the sealing layer comprises:

providing the cured product for forming an organic layer to a region where an organic layer is to be formed on the display unit; and forming an organic layer by exposing the cured product for forming an organic layer to light.

17. The method of claim 15, wherein the forming of the sealing layer comprises forming an inorganic layer by a reactive sputtering method or a chemical vapor deposition method using oxygen gas or oxygen plasma on the organic layer.

18. The method of claim 15, wherein the forming of the buffer layer comprises providing the cured product for forming a buffer layer on the sealing layer; and forming the buffer layer by exposing the cured product for forming a buffer layer to light.

19. The method of claim 15, wherein the forming of the touch screen layer comprises:

forming a plurality of first sensing patterns, a plurality of second sensing patterns, and an insulating layer on the plurality of first sensing patterns and the second sensing patterns on the buffer layer.

20. The method of claim 15, further comprising:

forming a protection film on the buffer layer; and removing the protection film prior to the forming of the touch screen layer on the buffer layer.

* * * * *